United States Patent
Nakamura et al.

(10) Patent No.: US 6,577,183 B1
(45) Date of Patent: Jun. 10, 2003

(54) OFFSET CORRECTION CIRCUIT

(75) Inventors: Katsufumi Nakamura, Boston, MA (US); Steven Decker, Derry, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/882,513

(22) Filed: Jun. 15, 2001

(51) Int. Cl.[7] .................................................. H03F 1/02
(52) U.S. Cl. ............................................ 330/9; 327/307
(58) Field of Search ............................... 330/9; 327/307

(56) References Cited

U.S. PATENT DOCUMENTS

| | | | | |
|---|---|---|---|---|
| 4,050,030 A | * | 9/1977 | Russell | 330/253 |
| 5,392,001 A | * | 2/1995 | Uhling et al. | 324/123 C |
| 5,508,656 A | * | 4/1996 | Jaffard et al. | 330/259 |
| 5,648,738 A | * | 7/1997 | Welland et al. | 327/307 |
| 5,844,439 A | * | 12/1998 | Zortea | 327/307 |
| 6,005,431 A | * | 12/1999 | Mehr et al. | 327/307 |
| 6,288,604 B1 | * | 9/2001 | Shih et al. | 327/307 |
| 6,300,824 B1 | * | 10/2001 | Moughabghab | 330/9 |
| 6,317,064 B1 | * | 11/2001 | Ferrer et al. | 341/118 |
| 6,356,217 B1 | * | 3/2002 | Tilley et al. | 341/118 |

* cited by examiner

*Primary Examiner*—Michael Tokar
*Assistant Examiner*—Khai Nguyen
(74) *Attorney, Agent, or Firm*—Wolf, Greenfield & Sacks, P.C.

(57) ABSTRACT

An offset correction circuit loop with summing nodes, a variable gain transconductance amplifier and capacitor. The input to the loop is sent to a first summing node and then to a separate circuit. The output of the separate circuit is sent to the output of the loop and to the input of a second summing node. The second summing node subtracts the circuit output from a reference voltage and sends the result to the transconductance amplifier which outputs a corrective current which is then integrated onto the capacitor to produce a corrective input offset voltage estimate.

43 Claims, 11 Drawing Sheets

Offset Correction Loop Around Circuit With Lowpass Filter (LPF)

Figure 1: Offset Correction Loop (Prior Art)

Figure 2: Offset Correction Loop Around Circuit (Prior Art)

Figure 3: Offset Correction Loop with $G_m$-C Clamp

Figure 4: Offset Correction Loop Around Circuit with $G_m$-C Clamp

Figure 5: Offset Correction Loop Around Circuit With Lowpass Filter (LPF)

Figure 6: Conventional $G_m$ Circuit (Prior Art)

Figure 7: Variable Gain $G_m$ Circuit with Single Output

Figure 8: Variable Gain $G_m$ Circuit with Triode-NMOS Load and Differential Output Figure 9: Variable Gain $G_m$ Circuit Transfer Characteristic Figure 10: Lowpass Filter (Prior Art)

Figure 11: Switched-Capacitor Lowpass Filter (Prior Art)

OFFSET CORRECTION CIRCUIT

FIELD

The present invention is related to an offset correction circuit.

BACKGROUND

A signal processing system may consist of one or more stages of amplification, filtering, buffering, or other operations on a voltage waveform. The voltage waveform is usually the sum of a time-varying signal, and a constant offset voltage which contains no information and may interfere with the processing of the voltage waveform. For example, the offset voltage may limit the amount of amplification that can be applied to the voltage waveform.

Figure 1:
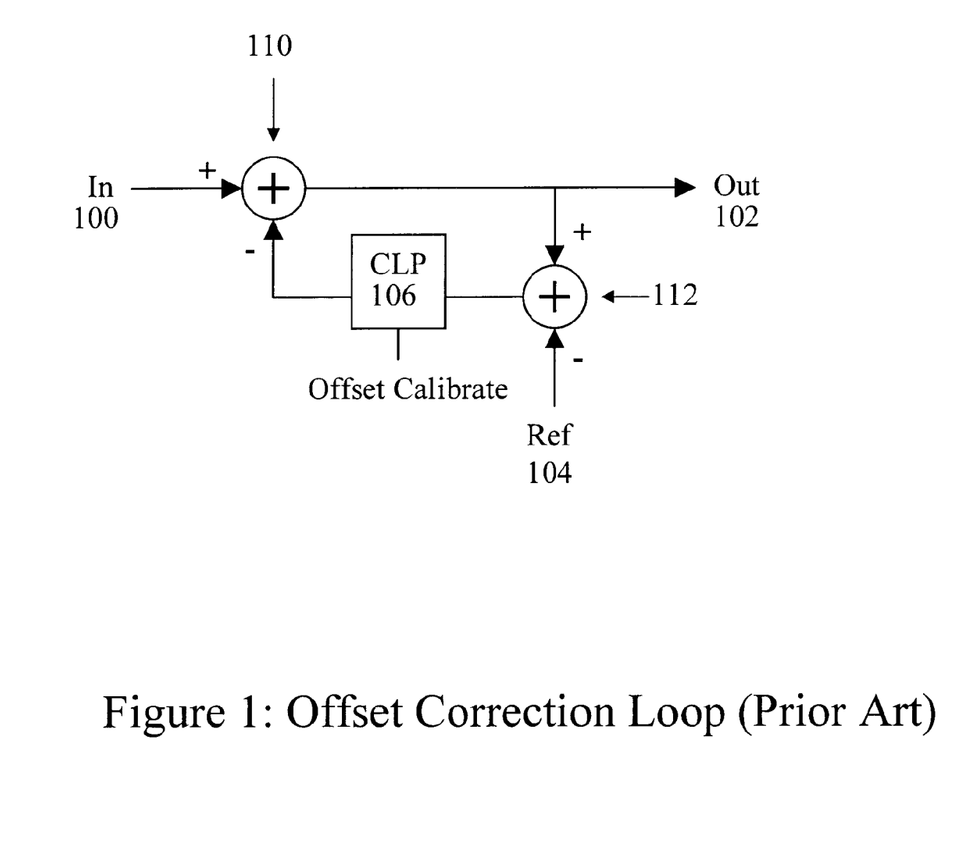
FIG. 1 shows an offset correction loop according to the prior art.

An offset correction loop can be used to remove a fixed offset or a slowly-varying offset. FIG. 1 shows a typical offset correction loop. The input voltage 100 is the sum of an offset voltage and a signal voltage. A clamp circuit 106 generates an estimate of the offset voltage which is subtracted from the input voltage 100 by a summer 110. The offset voltage estimate is updated based on the difference between the output voltage 102 and the reference voltage 104 during offset calibrate intervals, during which the signal voltage is known to be zero.

For example, if the output voltage 102 is higher than the reference voltage 104 during an offset calibrate interval, the clamp 106 will increase the input offset estimate. If the output voltage 102 is lower than the reference voltage 104 during the offset calibrate interval, then the input offset estimate that is subtracted from the input voltage 100 is decreased. The loop settles when the output voltage 102 equals the reference voltage 104 during the offset calibrate intervals.

Normally, circuits not only take offset voltages from input signal waveforms but also have internal offsets which create offset voltages at their outputs. For example, to remove the offset of an amplifier, one could use an offset correction loop prior to the amplifier to keep it from saturating as a result of input offset voltage, and another offset correction loop after the amplifier to remove any offset voltage produced by the amplifier itself. The offset correction loop of FIG. 1 can be used for both purposes.

Figure 2:
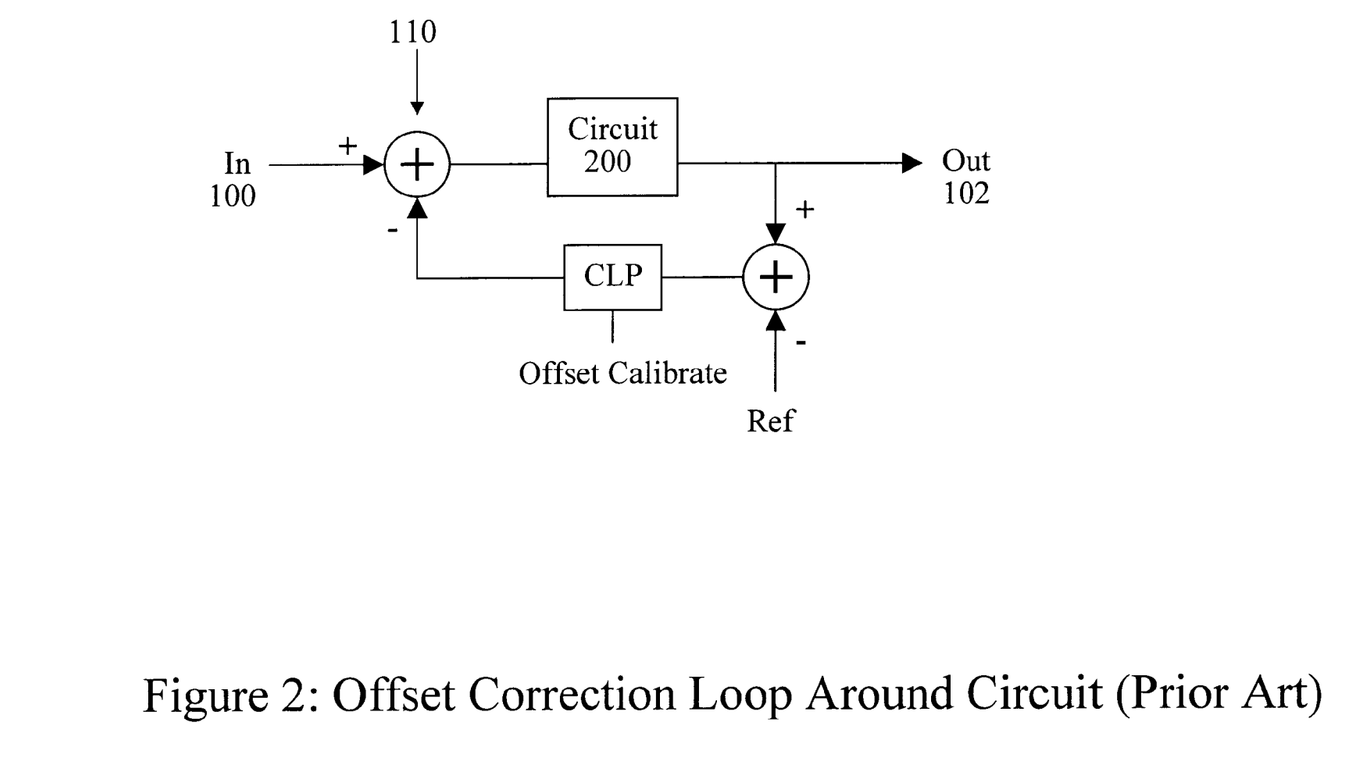
FIG. 2 shows an offset correction loop around a circuit according to the prior art.

In FIG. 2, a offset correction circuit 200 is located between the output of the first summer 110 and the output voltage 102. The advantage of this architecture is that a single offset correction loop can be used to remove offsets in both the input waveform and the added circuit.

SUMMARY

The present invention is directed to an offset correction circuit comprising a first summing unit, a second summing unit, a differential transconductance amplifier, and a capacitor. The differential transconductance amplifier is located between the output of the second summing unit and the second input of the first summing unit; the capacitor located between the second input of the first summing unit and a first reference voltage. The offset correction circuit input may be located before the first input of the first summing unit and the offset correction circuit output may be located between the output of the first summing unit and the first input of the second summing unit. In other embodiments, the differential transconductance amplifier may be implemented with fully differential output and may use variable resistors. The variable resistors may be implemented with NMOS devices. In another embodiment the differential transconductance amplifier is nonlinear.

In an embodiment of the invention a separate circuit is located between the output of the first summing unit and the circuit output. In another embodiment a switch is located between an output of variable gain amplifier and the capacitor. A second reference voltage may be coupled to the second input of the second summing unit. In a further embodiment a lowpass filter is located between the output of the second summing unit and an input of the voltage integrator. The lowpass filter may be an R-C filter employing a switched-capacitor resistor.

A further embodiment of the invention is directed to a method of correcting a circuit offset, the method comprising the steps of: providing a voltage integrator, comprising an transconductance amplifier and a capacitor, between a circuit input and a circuit output; calibrating the voltage integrator by storing an input offset voltage on the capacitor; and subtracting the input offset voltage estimate from an input waveform.

A further embodiment of the invention is directed to an offset correction loop comprising a transconductance amplifier connected between a circuit input and a circuit output, a capacitor connected between a circuit input and a reference voltage, and a switch controlled by an offset calibrate signal.

DETAILED DESCRIPTION

The offset correction loops of FIGS. 1 and 2 can be approximated as linear first-order systems during offset calibration intervals. Therefore, their start-up behavior and response to changes in the input offset voltage are determined by a clamp loop time constant, as well as by the time between and duration of the offset calibration intervals. System constraints often fix the time between calibration intervals and the duration of those intervals, but the clamp loop time constant can be adjusted to trade-off start-up time and noise in the offset estimate.

Figure 3:
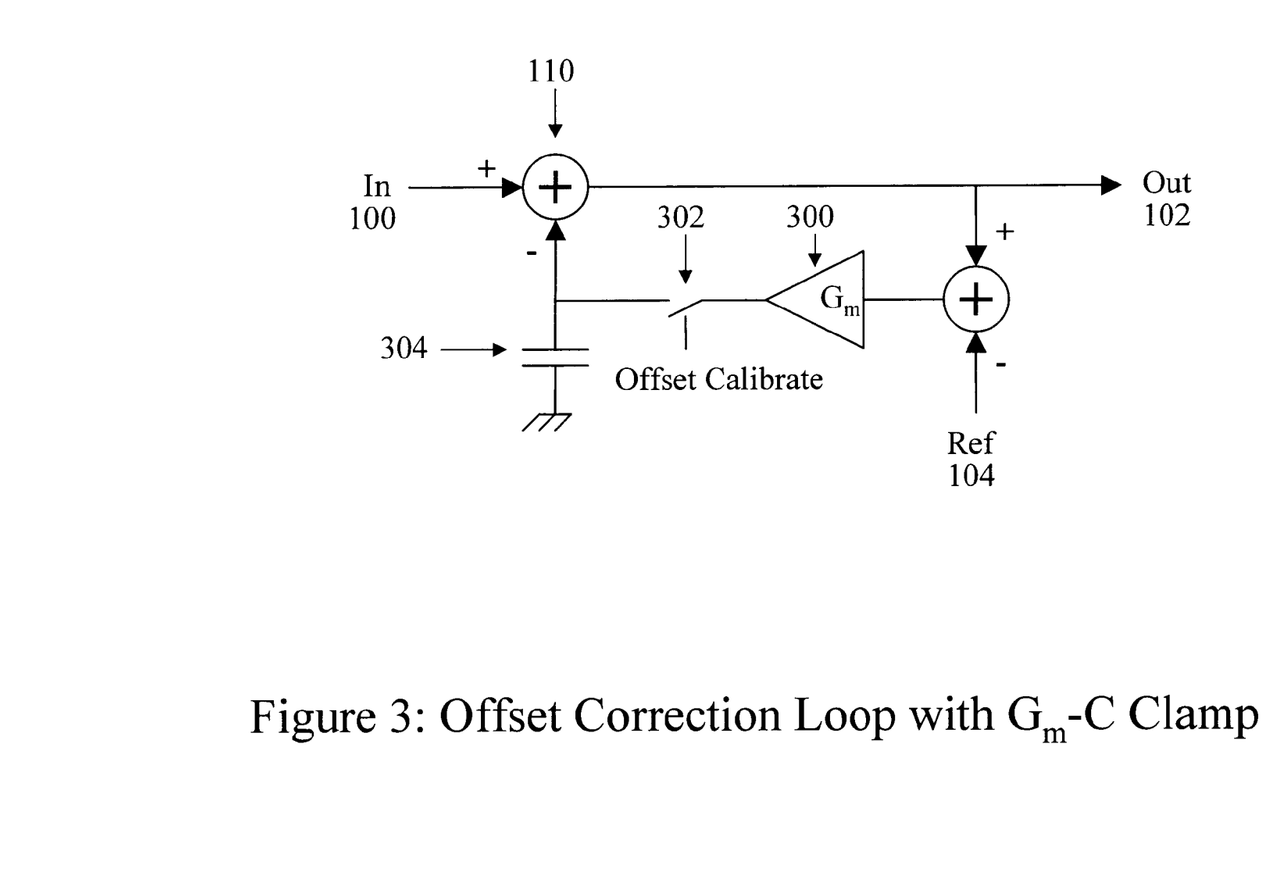
FIG. 3 shows an offset correction loop with a voltage integrator according to the invention.

In the preferred embodiment, the clamp circuit 106 is a voltage integrator, consisting of a transconductance stage and a capacitor. FIG. 3 shows this embodiment of the offset correction loop. The clamp block is shown as a transconductance stage 300, a switch 302 controlled by the offset calibrate signal, and a capacitor 304. After an initial calibration, when the offset calibration signal is active, the switch 302 is opened and the constant input offset voltage estimate held on the capacitor 304 is subtracted from the input waveform 100. When the offset calibration signal is active (during an offset calibration interval), the switch 302 is closed. The transconductance stage 300 delivers a current which is a positive function of its input voltage. Its input voltage is a function of the reference voltage 104 subtracted from the output voltage 102. The current delivered by the output of transconductance stage 300 is integrated onto the capacitor 304. If the output voltage 102 exceeds the reference voltage 104, the transconductance current charges up the capacitor, increasing the voltage subtracted from the input waveform. If the reference voltage 104 exceeds the output voltage 102, the capacitor 304 is charged down, decreasing the voltage subtracted from the input waveform 100.

Figure 4:
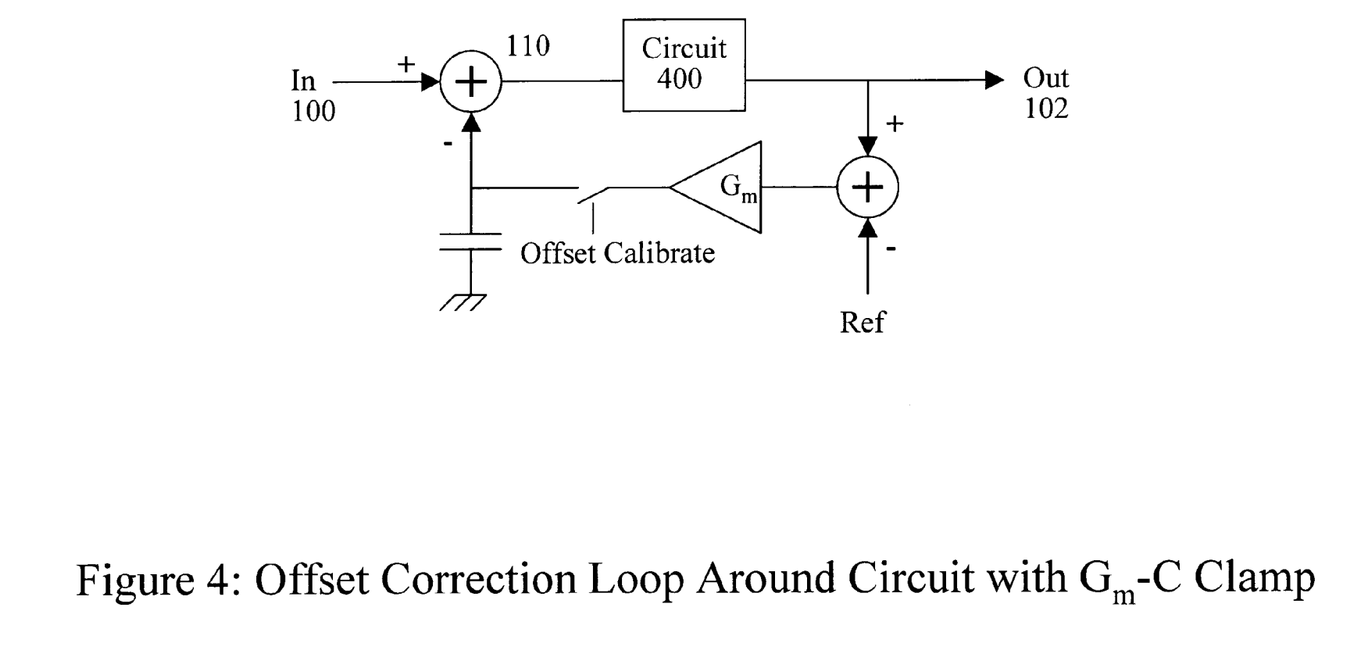
FIG. 4 shows an offset correction loop with a voltage integrator around a circuit according to the invention.

FIG. 4 shows the offset correction loop of FIG. 3 with a circuit 400 placed between the output of the first summer 110 and the output voltage 102. This loop operates in a similar manner to the loop of FIG. 2 where the offset voltage from the input waveform 100 and the offset voltage created by the circuit 400 are both removed by the offset correction of FIG. 4.

The time constant of a linear correction loop is a measure of the amount of time needed by the offset correction loop to settle, meaning the amount of time necessary to compensate for any offset voltage. The time constant must be low enough so that the correction loop can correct for offsets which change in time, but high enough that the input offset estimate is not too noisy. For example, in a CCD imaging system, a noisy input offset estimate appears as horizontal streaks in the image. The start-up time (the time required for the loop to settle when the power is turned on) is limited by the maximum output current of the transconductance stage. For a linear transconductance, this time is proportional to the loop time constant, forcing a trade-off between start-up time and noise in the input offset estimate.

Figure 6:
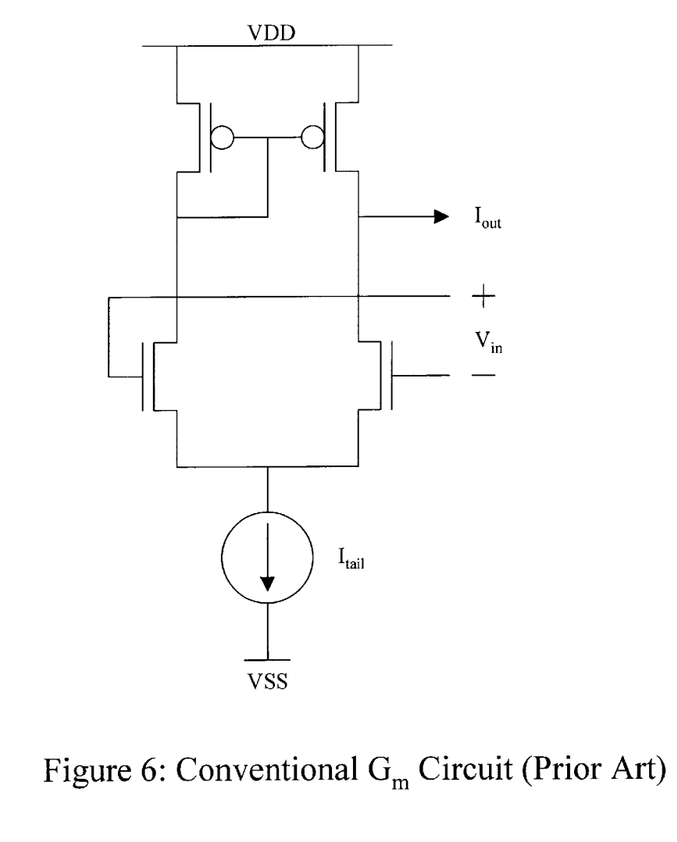
FIG. 6 shows a transistor level diagram of a conventional transconductance circuit according to the prior art.
Figure 7:
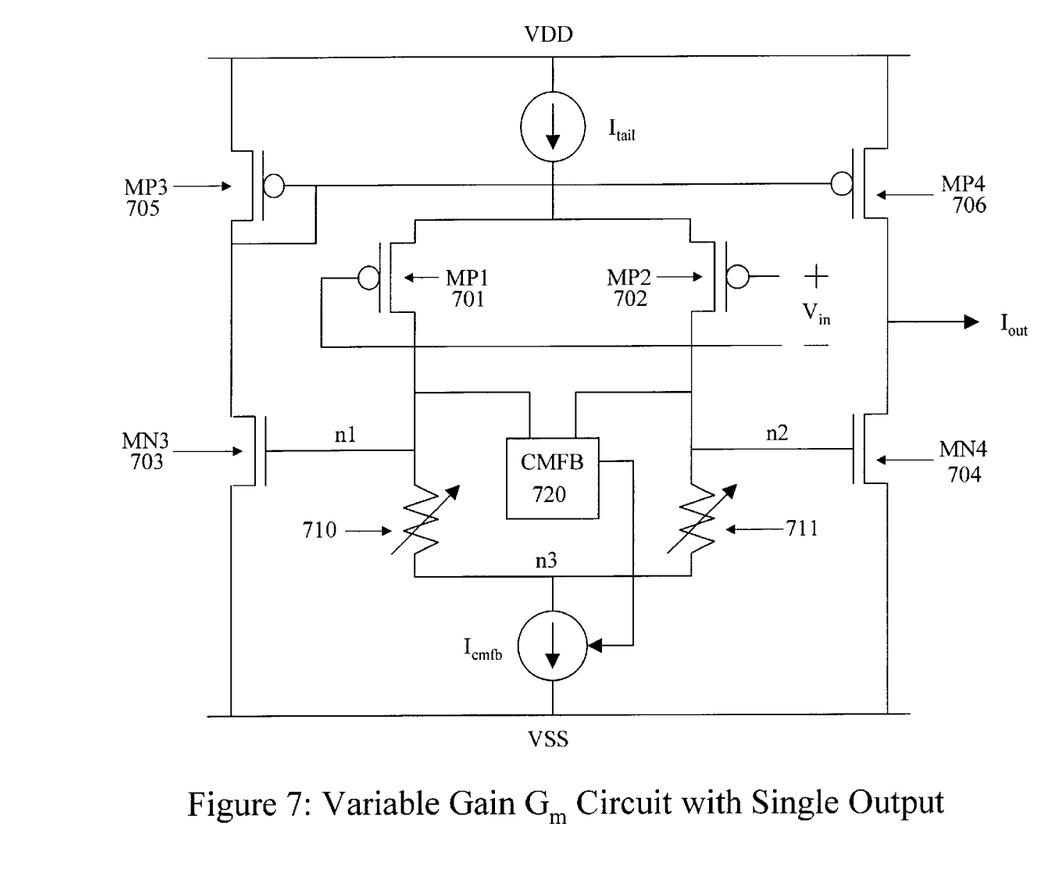
FIG. 7 shows a detailed diagram of a variable gain transconductance circuit with variable resistors and single output according to the invention.

FIG. 6 shows a detailed diagram of a conventional transconductance circuit, in which the output current is approximately proportional to the input voltage. FIG. 7 shows a variable gain transconductance amplifier which is used in an embodiment of the invention. The input transistors 701 and 702 convert the input voltage $V_{in}$ to a differential current which is then converted back into a differential voltage V(n1, n2) by the variable resistors 710 and 711. This differential voltage is converted back into a differential current through NMOS transistors 703 and 704 and PMOS transistors 705 and 706. The overall gain, $I_{out}/V_{in}$, can be changed through the variable resistance. A common mode feedback circuit 720 is required to bias the circuit correctly, but does not directly affect the gain.

Figure 8:
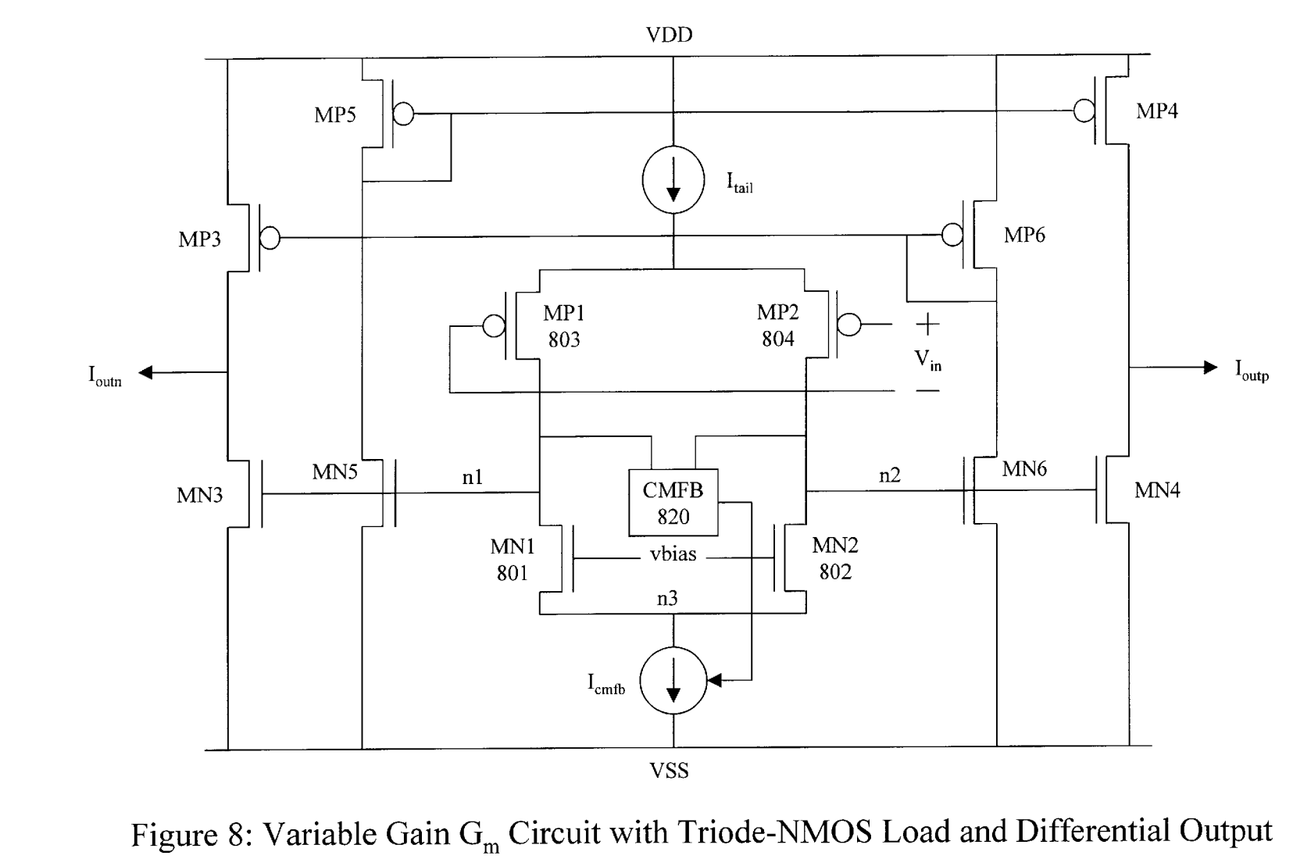
FIG. 8 shows a detailed diagram of a variable gain transconductance circuit with triode region NMOS load and differential output according to the invention.

FIG. 8 shows a specific implementation of the variable gain transconductance stage shown in FIG. 7 where the variable resistors are implemented by NMOS transistors. NMOS transistors 801 and 802 are provided a fixed gate bias voltage vbias which keeps the NMOS devices 801 and 802 in the triode region for small input voltages $V_{in}$. In the triode region of operation, transistors behave like resistors for small drain-source voltages, where the effective resistance is set by the gate-source voltage. As $V_{in}$ increases, more current flows through the PMOS transistor 803 and NMOS 801, increasing transistor 801's drain voltage n1. As n1 increases beyond a certain voltage, transistor 801 moves into the saturated region of operation and the drain impedance greatly increases. When this occurs, the voltage gain V(n1, n2)/$V_{in}$ greatly increases and the overall transconductance greatly increases. Furthermore, FIG. 8 shows the transconductance stage with fully differential output, which is convenient for systems in which the signal path is itself fully differential. Differential signal paths are commonly used in analog circuitry to reduce the influence of power supply noise or noise coupled in from other circuitry. A further benefit of differential signal paths is a doubling of signal range, which can improve signal-to-noise ratio.

Figure 5:
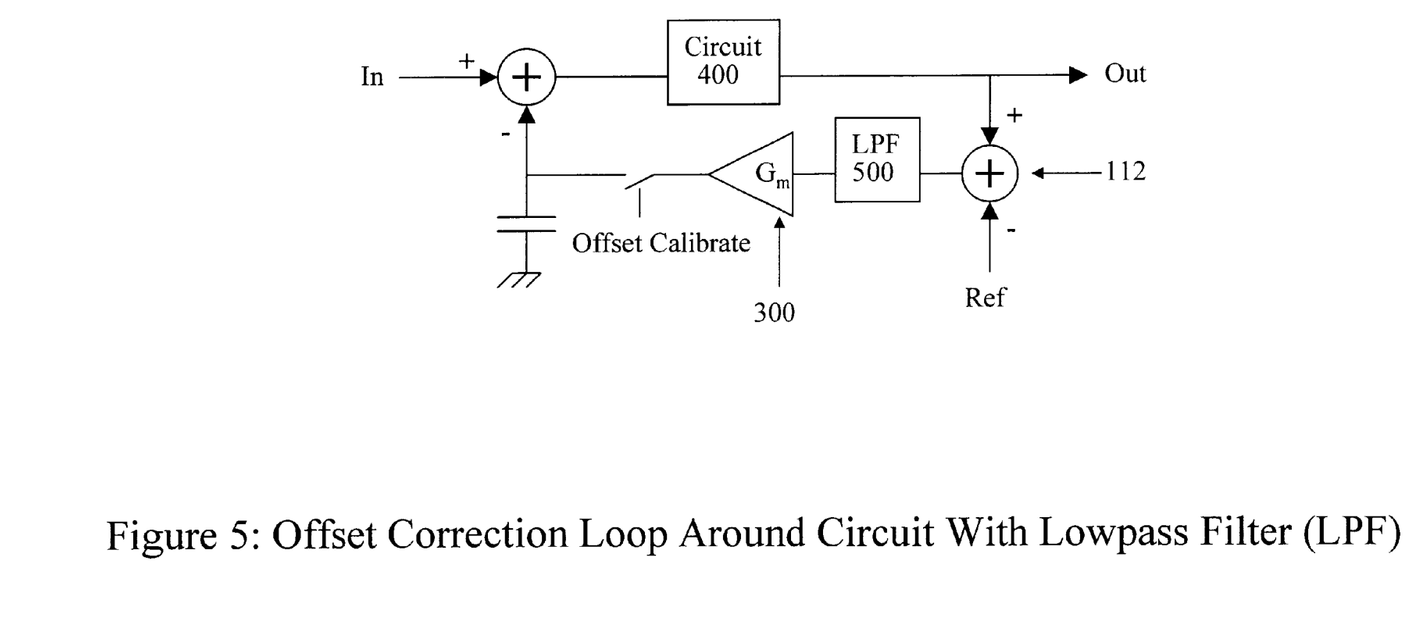
FIG. 5 shows an offset correction loop with a lowpass filter and voltage integrator around a circuit according to the invention.
Figure 9:
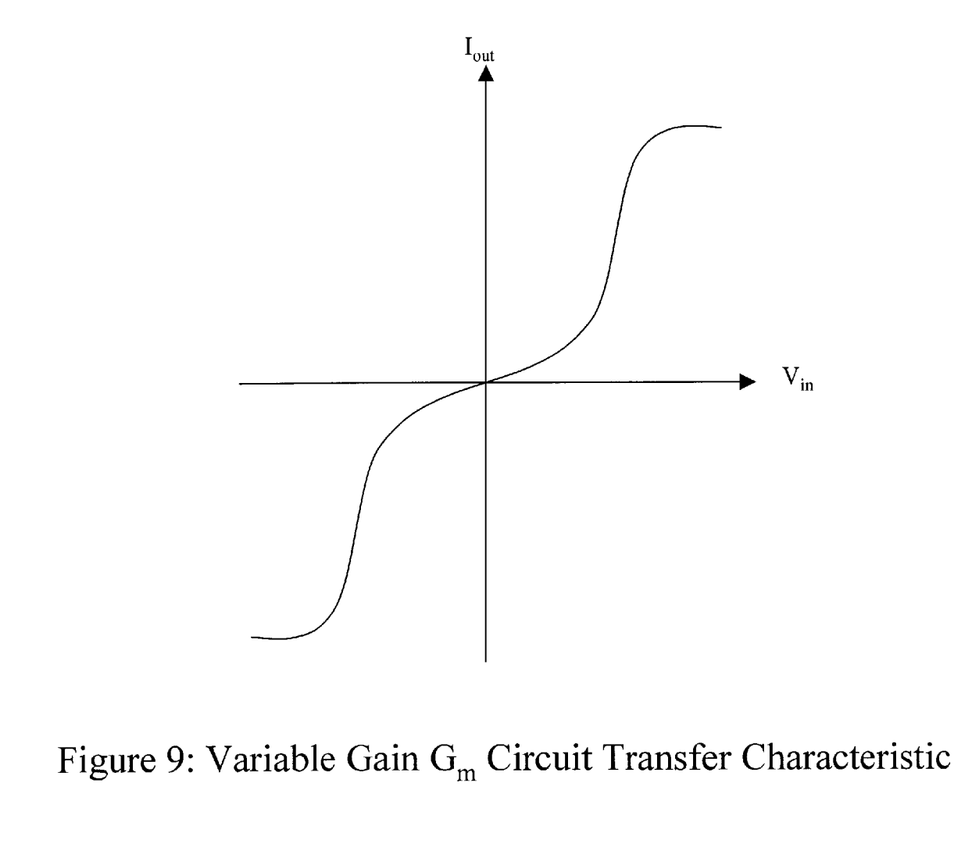
FIG. 9 shows the transfer characteristic of a variable gain transconductance circuit according to the invention.

FIG. 9 shows a typical $V_{in}$ versus $I_{out}$ transfer characteristic for the transconductance amplifiers of FIGS. 7 and 8. For small $V_{in}$, the slope of the characteristic is approximately constant and the circuit behaves like a conventional linear transconductance amplifier. For large $V_{in}$, the output current is much higher. The advantage of this transfer characteristic is that it simultaneously allows a short start-up time and a long loop time constant. The potential disadvantage of the nonlinear transfer function is that large error spikes in the input waveform produce a change in the input offset estimate out of proportion to their magnitude, making the input offset estimate appear noisy. Using a lowpass filter as shown in FIG. 5 reduces this effect by smoothing out the spike so that the transconductance amplifier's input voltage stays within the low-gain region.

Figure 10:
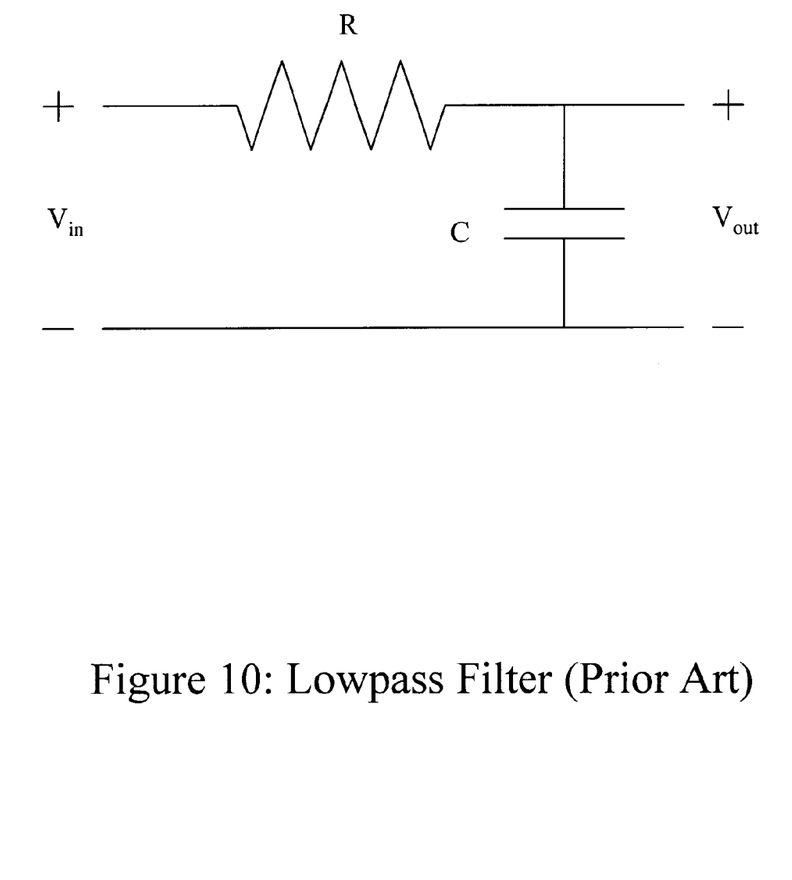
FIG. 10 shows a lowpass filter according to the prior art.

FIG. 10 shows a basic lowpass filter. Using this lowpass filter in the offset correction circuit of the invention has two specific problems. First, the time constant of the lowpass filter is determined by the product of a resistance and a capacitance, which results in process and temperature sensitivities. Second, the capacitive load presented to the circuit which drives the lowpass filter is the sum of the lowpass filter capacitance and the transconductance amplifier input capacitance, which can be a large quantity, which makes it difficult to drive.

Figure 11:
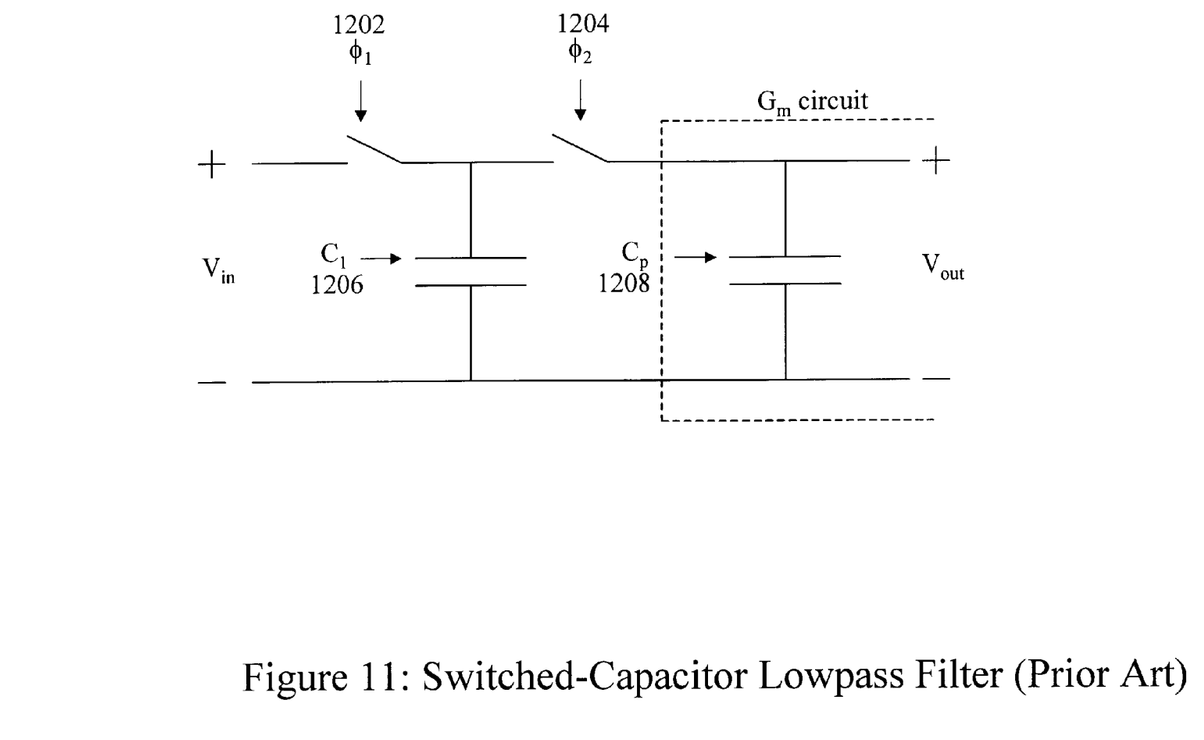
FIG. 11 shows a switched-capacitor lowpass filter according to the prior art.

FIG. 11 shows an improved version of the lowpass filter which utilizes a two phase non-overlapping clock. $C_p$ 1208 represents the input capacitance of the transconductance stage and is not a distinct capacitor itself. The time constant of this lowpass filter is set by the ratio $C_1/C_p$ of the capacitances of the capacitors 1206 and 1208, and the clocking frequency of the switches 1202 and 1204, all of which can be well controlled. A further advantage is that capacitor 1206 can be substantially smaller than the input capacitance of the transconductance stage 1208 so that the circuit which drives the lowpass filter need only have enough power to drive capacitor 1206, and not the transconductance amplifier input capacitor. This basic input configuration is referred to as a switched-capacitor resistor.

What is claimed is:
1. An offset correction loop comprising:
   a first summing unit comprising
      a first input,
      a second input, and
      an output;
   a second summing unit comprising.
      a first input,
      a second input, and
      an output;
   a differential transconductance amplifier having a transconductance that varies in response to a change in a voltage at an input of the differential transconductance amplifier;

a capacitor;
the differential transconductance amplifier located between the output of the second summing unit and the second input of the first summing unit;
the capacitor located between the second input of the first summing unit and a first reference voltage;
a circuit input located before the first input of the first summing unit;
a circuit output located between the output of the first summing unit and the first input of the second summing unit.

2. The offset correction loop of claim 1 wherein a circuit is located between the output of the first summing unit and the circuit output.

3. The offset correction loop of claim 1 or 2, wherein a switch is located between an output of the differential transconductance amplifier and the capacitor.

4. The offset correction loop of claim 1 or 2, wherein a second reference voltage is coupled to the second input of the second summing unit.

5. The offset correction loop of claim 1 or 2, wherein a lowpass filter is located between the output of the second summing unit and the input of the differential transconductance amplifier.

6. The offset correction loop of claim 5, wherein the lowpass filter is an R-C filter employing a switched-capacitor resistor.

7. The offset correction loop of claim 1, wherein the differential transconductance amplifier uses variable resistors implemented with NMOS devices.

8. The offset correction loop of claim 7 wherein the NMOS devices are transistors, and wherein the transistors have a resistance that varies as the voltage at the input of the differential transconductance amplifier varies.

9. The offset correction loop of claim 1, wherein the output of the second summing unit is the input of the differential transconductance amplifier.

10. A method of correcting a circuit offset, the method comprising the steps of:
providing a voltage integrator, comprising a differential transconductance amplifier and a capacitor, between a circuit input and a circuit output;
varying a transconductance of the differential transconductance amplifier in response to a change in a voltage input to the differential transconductance amplifier;
calibrating the voltage integrator by applying an input offset voltage across the capacitor; and
subtracting the input offset voltage from an input waveform.

11. The method of claim 10 further comprising the steps of:
if a signal on the circuit output exceeds a reference voltage increasing the input offset voltage across the capacitor;
if the reference voltage exceeds the signal on the circuit output decreasing the input offset voltage across the capacitor;
subtracting the input offset voltage from the input waveform.

12. The method of claim 10 wherein the differential transconductance amplifier uses variable resistors implemented with NMOS devices.

13. The method of claim 12 wherein the NMOS devices are transistors, and wherein the transistors have a resistance that varies as the voltage input to the differential transconductance amplifier varies.

14. An offset correction loop comprising:
a differential transconductance amplifier coupled between a circuit input and a circuit output, wherein the differential transconductance amplifier has a transconductance that varies in response to a change in a voltage at an input of the differential transconductance amplifier;
a capacitor coupled between the circuit input and a reference voltage;
a switch controlled by an offset calibration signal; and
a low pass filter.

15. The offset correction loop of claim 14 wherein the transconductance amplifier uses variable resistors.

16. The offset correction loop of claim 15 wherein the variable resistors are implemented with NMOS devices.

17. The offset correction loop of claim 16 wherein the NMOS devices are transistors, and wherein the transistors have a resistance that varies as the voltage at the input of the differential transconductance amplifier varies.

18. An offset correction loop comprising:
a first summing unit comprising
a first input,
a second input, and
an output;
a second summing unit comprising
a first input,
a second input, and
an output;
an integrator located between the output of the second summing unit and the second input of the first summing unit and coupled to a first reference voltage;
a circuit input located before the first input of the first summing unit;
a circuit output located between the output of the first summing unit and the first input of the second summing unit; and
a lowpass filter located between the output of the second summing unit and an input of the integrator.

19. The offset correction loop of claim 18, wherein the lowpass filter is an R-C filter employing a switched-capacitor resistor.

20. The offset correction loop of claim 18, wherein a circuit is located between the output of the first summing unit and the circuit output.

21. The offset correction loop of claim 18, wherein the integrator comprises a transconductance amplifier located between the output of the second summing unit and the second input of the first summing unit, and a capacitor located between the second input of the first summing unit and the first reference voltage.

22. The offset correction loop of claim 21, wherein a switch is located between an output of the differential transconductance amplifier and the capacitor.

23. The offset correction loop of claim 18, wherein a second reference voltage is coupled to the second input of the second summing unit.

24. A method of correcting a circuit offset, the method comprising the steps of:
providing a voltage integrator, comprising a transconductance amplifier and a capacitor, between a circuit input and a circuit output;
lowpass filtering an input to the transconductance amplifier;
calibrating the voltage integrator by applying an input offset voltage across the capacitor; and
subtracting the input offset voltage from an input waveform.

25. An offset correction loop comprising:
- a transconductance amplifier coupled between a circuit input and a circuit output;
- a capacitor coupled between the circuit input and a reference voltage;
- a switch controlled by an offset calibration signal; and
- a lowpass filter coupled between the circuit output and the transconductance amplifier.

26. An offset correction loop comprising:
- a first summing unit comprising
  - a first input,
  - a second input, and
  - an output;
- a second summing unit comprising
  - a first input,
  - a second input, and
  - an output;
- an integrator having a time constant that varies in response to an input of the integrator, wherein the integrator is located between the output of the second summing unit and the second input of the first summing unit and is coupled to a first reference voltage;
- a circuit input located before the first input of the first summing unit;
- a circuit output located between the output of the first summing unit and the first input of the second summing unit.

27. The offset correction loop of claim 26, wherein a circuit is located between the output of the first summing unit and the circuit output.

28. The offset correction loop of claim 26, wherein the integrator comprises a transconductance amplifier located between the output of the second summing unit and the second input of the first summing unit, and a capacitor located between the second input of the first summing unit and the first reference voltage.

29. The offset correction loop of claim 26, wherein a second reference voltage is coupled to the second input of the second summing unit.

30. The offset correction loop of claim 26, wherein a lowpass filter is located between the output of the second summing unit and the input of the voltage integrator.

31. The offset correction loop of claim 30, wherein the lowpass filter is an R-C filter employing a switched-capacitor resistor.

32. The offset correction loop of claim 26, wherein the integrator uses variable resistors implemented with transistors.

33. The offset correction loop of claim 32, wherein the transistors have a resistance that varies as the input of the integrator varies.

34. A method of correcting a circuit offset, the method comprising the steps of:
- providing a voltage integrator, comprising a transconductance amplifier and a capacitor, between a circuit input and a circuit output;
- varying a transconductance of the transconductance amplifier in response to a change in a voltage input to the transconductance amplifier;
- calibrating the voltage integrator by applying an input offset voltage across the capacitor; and
- subtracting the input offset voltage from an input waveform.

35. The method of claim 34, further comprising the steps of:
- if a signal on the circuit output exceeds a reference voltage, increasing the input offset voltage across the capacitor;
- if the reference voltage exceeds the signal on the circuit output, decreasing the input offset voltage across the capacitor;
- subtracting the input offset voltage from the input waveform.

36. The method of claim 34, wherein the transconductance amplifier uses variable resistors implemented with transistors.

37. The method of claim 36, wherein the transistors have a resistance that varies as the voltage input to the transconductance amplifier varies.

38. The method of claim 34, further comprising a step of lowpass filtering the voltage input to the transconductance amplifier.

39. An offset correction loop comprising:
- a transconductance amplifier coupled between a circuit input and a circuit output, wherein the transconductance amplifier has a transconductance that varies in response to a change in a voltage at an input of the transconductance amplifier;
- a capacitor coupled between the circuit input and a reference voltage; and
- a switch controlled by an offset calibration signal.

40. The offset correction loop of claim 39, further comprising a lowpass filter.

41. The offset correction loop of claim 40, wherein the transconductance amplifier uses variable resistors.

42. The offset correction loop of claim 41, wherein the variable resistors are implemented with transistors.

43. The offset correction loop of claim 42, wherein the transistors have a resistance that varies as the voltage at the input of the transconductance amplifier varies.

* * * * *